United States Patent [19]

Kawasaki

[11] Patent Number: 5,605,601
[45] Date of Patent: Feb. 25, 1997

[54] METHOD OF MANUFACTURING SEMICONDUCTOR DEVICE

[75] Inventor: Satoshi Kawasaki, Hyogo, Japan

[73] Assignee: Mitsubishi Denki Kabushiki Kaisha, Tokyo, Japan

[21] Appl. No.: 594,196

[22] Filed: Jan. 31, 1996

[30] Foreign Application Priority Data

Sep. 19, 1995 [JP] Japan ................... 7-239858

[51] Int. Cl.$^6$ ............................. H01L 21/3065
[52] U.S. Cl. ................... 156/643.1; 156/651.1; 156/653.1; 437/228
[58] Field of Search .............. 156/646.1, 643.1, 156/656.1, 657.1, 651.1, 652.1, 653.1

[56] References Cited

U.S. PATENT DOCUMENTS

| | | | |
|---|---|---|---|
| 5,164,330 | 11/1992 | Davis et al. | 437/192 |
| 5,228,950 | 7/1993 | Webb et al. | 156/643 |
| 5,397,962 | 3/1995 | Moslehi | 315/111.51 |
| 5,441,914 | 8/1995 | Taft et al. | 437/189 |

FOREIGN PATENT DOCUMENTS 3-175628  7/1991  Japan .................. H01L 21/302

*Primary Examiner*—R. Bruce Breneman
*Assistant Examiner*—Michael E. Adjodha
*Attorney, Agent, or Firm*—Lowe, Price, LeBlanc & Becker

[57] ABSTRACT

A method of manufacturing a semiconductor device is obtained by which a desired pattern is formed, high yield of semiconductor devices can be achieved and the number of steps employed and hence production cost can be reduced. In the method of manufacturing a semiconductor device, a titanium silicide film and part of a polysilicon film are anisotropically etched under the conditions of $Cl_2/NF_3=40/20$ sccm and a gas pressure of 1.2 mTorr. Then, polysilicon film is anisotropically etched using a mixed gas of $Cl_2$ and $O_2$. $NF_3$ completely dissociates. Nitrogen atoms serve as a strong protecting film for a sidewall of the pattern so that side-etching does not occur, thereby providing a desired pattern shape. Since each film is etched in the same device, the number of steps employed and hence production cost can be reduced. Furthermore, production of foreign particles can be reduced and hence high yield of semiconductor devices can be achieved.

10 Claims, 13 Drawing Sheets

| PRESSURE | mTorr | 0.6 | 1.2 | 3.0 | 5.0 | 10.0 |
|---|---|---|---|---|---|---|
| $Cl_2/NF_3$ | sccm | 20/10 | 40/20 | 40/20 | 40/20 | 40/20 |
| NOTCHING | OVER-ETCHING 50% | NONE | NONE | NONE | SLIGHTLY FOUND | FOUND |
| | OVER-ETCHING 25% | — | — | — | NEARLY NONE | — |

| Cl₂/NF₃= sccm | 40/20 | 30/30 | 20/40 | 10/50 |
|---|---|---|---|---|
| NUMBER OF FOREIGN PARTICLES (>0.3 μm) | 29 | 26 | 96 | 251 |

FIG. 4

| PRESSURE | mTorr | 0.6 | 1.2 | 3.0 | 5.0 | 10.0 |
|---|---|---|---|---|---|---|
| Cl₂/NF₃ | sccm | 20/10 | 40/20 | 40/20 | 40/20 | 40/20 |
| NOTCHING | OVER-ETCHING 50% | NONE | NONE | NONE | SLIGHTLY FOUND | FOUND |
| | OVER-ETCHING 25% | — | — | — | NEARLY NONE | — |

METHOD OF MANUFACTURING SEMICONDUCTOR DEVICE

BACKGROUND OF THE INVENTION

1. Field of the Invention

The present invention relates to a method of manufacturing a semiconductor device and particularly to a dry-etching method which dry-etches a multi-layer film including films of different kinds.

2. Description of the Background Art

With finer patterning and higher integration of a semiconductor device, there is a further need for high control performance on the final shape, reduction of foreign particles, improvement in productivity and cost reduction in dry-etching technique, which is one of fine-patterning techniques.

Figure 31:
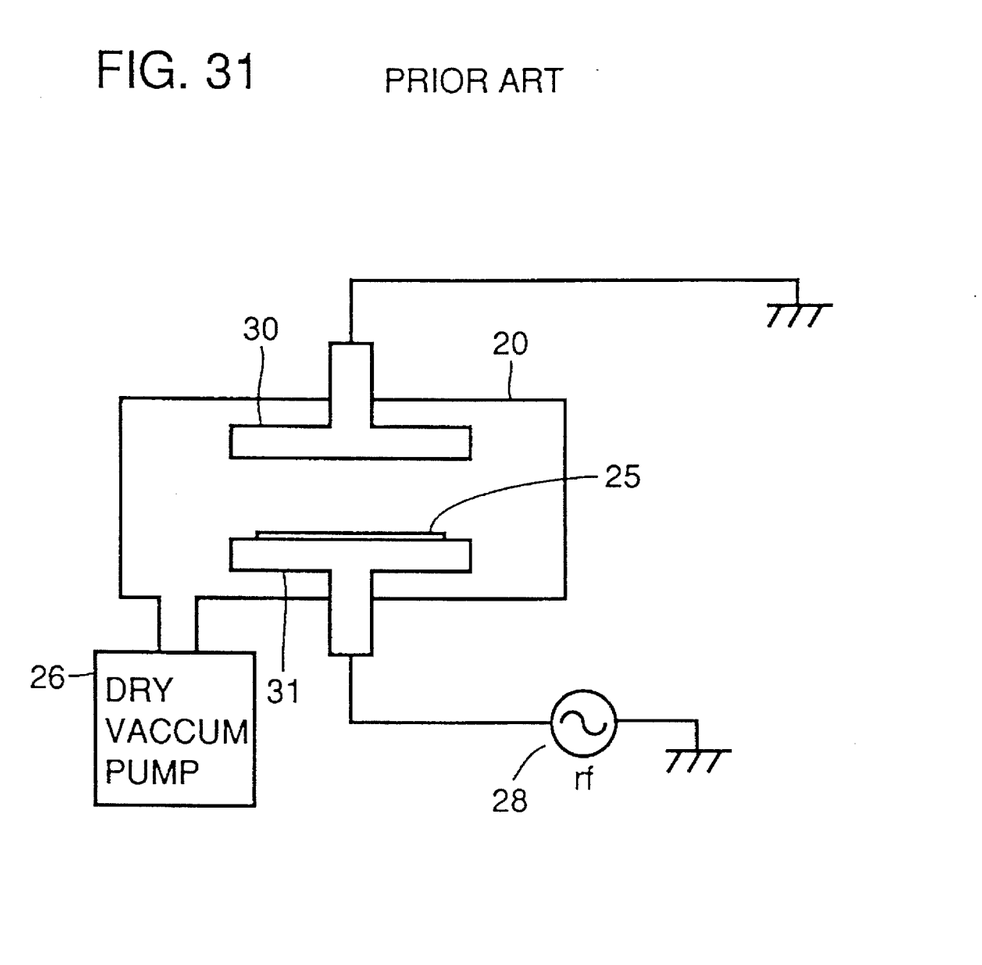
FIG. 31 shows a device structure of a conventional parallel-plate type RIE.

One of dry-etching systems is RIE (Reactive Ion Etching) device employing a reactive gas. One example is shown in FIG. 31. The device has a so-called parallel-plate type structure in which an anode 30 and a cathode 31 opposite to each other are provided within a chamber 20. A wafer 25 is mounted on cathode 31. The pressure inside chamber 20 is reduced by a dry vacuum pump 26 to approximately $10^3$ Torr. $CF_4$ is used as the reactive gas, for example. $CF_4$ discharges due to a high frequency (rf) 28 and a plasma occurs. In the plasma, $CF_4$ exists as $CF_{3+}$ ions. The $CF_3$ ions are accelerated by a space-charge region formed in the vicinity of a sample. The accelerated ions collide against the sample and hence a chemical reaction will occur between a reactive species absorbed on the sample and the sample, thereby etching the sample anisotropically. Other than such a gas of the CF system, there are various reactive gasses such as $Cl_2$ and HBr.

Typically, it is necessary to use a different etching system depending upon the kind of the film to be etched, since process parameters such as pressure and power are greatly varied depending upon whether the film to be etched is an oxide film, a polysilicon film or an aluminum film and since foreign particles should be reduced.

For a gas of the CF system, carbon contamination will occur since the gas contains carbon atoms. Thus, $NF_3$ is known as a gas which does not contain carbon atoms and is capable of etching both an oxide film and a polysilicon film. This is because $NF_3$ produces radical of fluorine atoms. This also allows $NF_3$ to be used as a gas for cleaning the inside of the chamber of an etching system used to etch polysilicon films.

However, when a polysilicon film is patterned by $NF_3$, for example, the radical of fluorine atoms etches a sidewall of the pattern. As a result, side-etching will occur and a desired pattern cannot be obtained. Furthermore, when $NF_3$ is used as the cleaning gas, it etches products adhering to the interior wall of the etching system, sometimes undesirably producing foreign particles.

Such a phenomenon is considered as follows: in the RIE provided with parallel-plate type electrodes, $NF_3$ dissociates as expressed by the following chemical formula:

$$NF_3 \rightarrow NF + 2F$$

or the following chemical formula:

$$NF_3 \rightarrow NF_2 + F.$$

As a result, the radical of fluorine atoms becomes dominant, causing side-etching or peeling off of the products on the interior wall of the chamber.

Generally in anisotropic etching, a sidewall protecting film is formed on a sidewall of a pattern. The protecting film protects the sidewall and a desired pattern is formed. Accordingly, in order to prevent side-etching or the like, it is required to protect the sidewall to overcome the action of the radical of fluorine atoms or to constrain the action itself of the radical of fluorine atoms.

$NF_3$ contains nitrogen atoms. By forming a nitride film containing the nitrogen atoms on the sidewall, a strong protecting film can be formed. For this purpose, it is essential that $NF_3$ completely dissociates into nitrogen atoms and fluorine atoms as shown in the following chemical formula:

$$NF_3 \rightarrow N + 3F.$$

Generally, dissociation of a reactive gas greatly depends on the gas pressure and plasma density within the chamber of an etching system. It is known for the parallel-plate type RIE that electron density or plasma density is approximately $10^{10}/cm^3$, pressure of the reactive. gas is at least 100 mTorr and ionization degree defined as the degree of ionized molecules is $10^{-4}$ to $10^{-30}$ However, as described above, in the parallel-plate type RIE, the nitrogen atom exists bound with fluorine atoms such as in the form of NF or $NF_2$. That is, this system structure could not supply energy enough to completely separate $NF_3$ into nitrogen atoms and fluorine atoms.

Conventionally, when films of different kinds are to be etched in a parallel-plate type RIE, it has been required to use a different etching system depending upon the kind of the film to be etched in order to reduce foreign particles within the chamber. As a result, the number of steps employed is increased, prolonging the process period and increasing production cost. Also, every time a wafer is inserted into or ejected from the etching system, foreign particles adheres onto a pattern and hence yield is degraded. Furthermore, if $NF_3$ is applied as a reactive gas which does not contain a carbon atom in order to prevent carbon contamination, $NF_3$ cannot dissociate sufficiently. As a result, a sidewall of a pattern is etched and hence a desired pattern cannot be obtained.

SUMMARY OF THE INVENTION

The object of the present invention is to provide a method of manufacturing a semiconductor device by which a desired pattern shape is suitably formed, the number of steps employed is decreased so that production cost is reduced and foreign particles are decreased, thereby enabling production of semiconductor devices with high yield.

In one aspect of the method of manufacturing the semiconductor device according to the present invention, a mixed gas containing $Cl_2$ and $NF_3$ is used under the conditions of a degree of vacuum of 0.1–5.0 mTorr and an electron density of at least $10^{10}/cm^3$ in etching a multi-layer film including a conductive layer and/or an insulating layer. Also, the ratio of $NF_3$ flow relative to the total flow of the mixed gas is set to be at most 70%.

According to the present manufacturing method, $NF_3$ is sufficiently energized and completely dissociates into nitrogen atoms and fluorine atoms as expressed by the following formula:

$$NF_3 \rightarrow N + 3F.$$

In etching, the nitrogen atoms adhere to a sidewall of a pattern and forms a nitride film. Furthermore, by addition of $Cl_2$, the ratio of $NF_3$ flow relative to the total flow does not exceed 70% and etching effect due to the radical of fluorine atoms is constrained. Therefore, side-etching can be prevented when etching a multi-layer film including a conductive layer and/or an insulating layer. Furthermore, production of foreign particles from the products adhering to an interior wall of the chamber can be reduced. Accordingly, a desired, suitable pattern shape can be obtained and yield of semiconductor devices can be increased. Furthermore, carbon contamination is prevented since the reactive gas does not contain carbon atoms. This allows a multi-layer film such as including a conductive layer and/or an insulating layer to be processed in the same etching system. Accordingly, the number of etching steps can be reduced and production cost can be reduced. Furthermore, adhesion of particles onto a wafer due to wafer handling or the like is eliminated and hence yield of semiconductor devices can be increased.

Furthermore, after the a multi-layer film including a conductive layer and/or an insulating layer is etched using the mixed gas containing $Cl_2$ and $NF_3$, there may be a further step added to etch the multi-layer film under the conditions of the same degree of vacuum and the same electron density but using a mixed gas containing $Cl_2$ or HBr.

In that case, the conductive layer is etched more rapidly than the insulating film. Therefore, the conductive layer can be etched while the insulating layer remains. Furthermore, since such etching can be performed in the same etching system, foreign particles can be prevented from adhering onto a wafer. Accordingly, high yield of semiconductor devices can be achieved.

Furthermore, the multi-layer film may include a polysilicon film and/or a metal silicide film. The multi-layer film may also include a silicon oxide film and/or a silicon nitride film.

In that case, electrode wirings having a variety of film structures can be formed. For example, an electrode wiring having a metal polycide structure including a polysilicon film and a metal silicide film, or an electrode wiring including a polysilicon film, silicon oxide film and silicon nitride film can be formed.

Furthermore, a natural oxide film is formed on the surface of the polysilicon film and it can also be considered to be part of the multi-layer film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
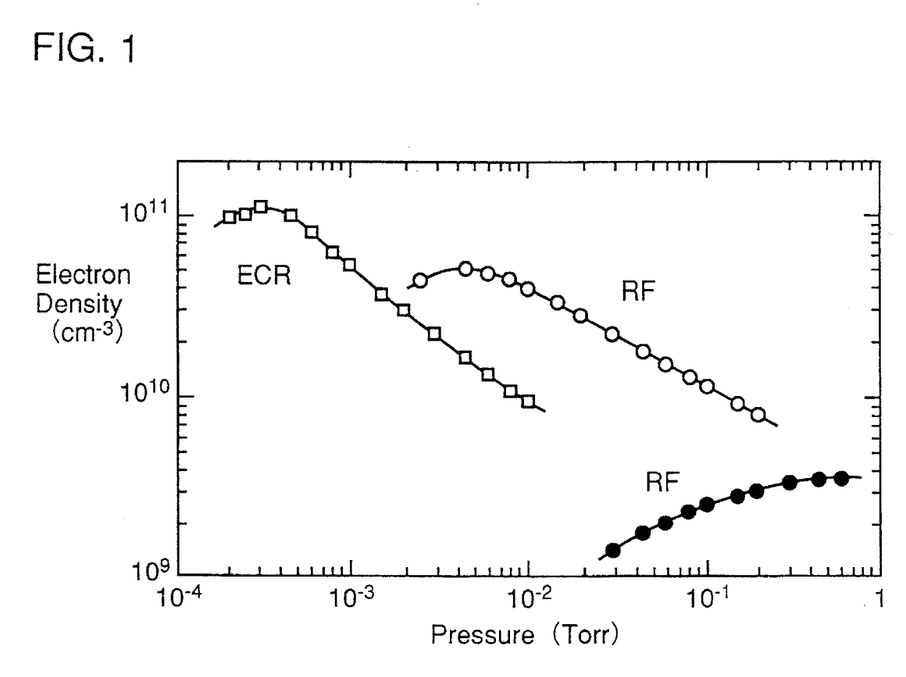
FIG. 1 shows the relation between electron density and pressure in $Cl_2$ plasma.

First of all, the applied etching system, flow ratio of the mixed gas $Cl_{2/NF3}$ and the range of gas pressure will be described. FIG. 1 shows the relation between electron density of $Cl_2$ plasma and pressure of $Cl_2$ for etching systems of different forms. A similar tendency is seen from the electron density and pressure of a mixed gas of $Cl_2/NF_3$. For a conventional RF type or RFMagnetron type RIE, the electron density is at most $10^{10}/cm^3$. and the pressure is at least 10 mTorr, while for an ECR (Electron Cyclotron Resonance) type RIE, the electron density is at most $10^{11}/cm^3$ and the pressure is at least 0.1 mTorr. Therefore, ionization degree is $10^{-4}$ to $10^{-3}$ in the conventional RF type RIE, while the ECR type RIE can achieve $10^{-1}$.

Accordingly, it is considered that, in the ECR type RIE, the reactive gas is highly ionized or resolved by electron impact and hence that reactive gas satisfactorily dissociates. Thus, the ECR type RIE device is applied as an etching system.

Figure 2:
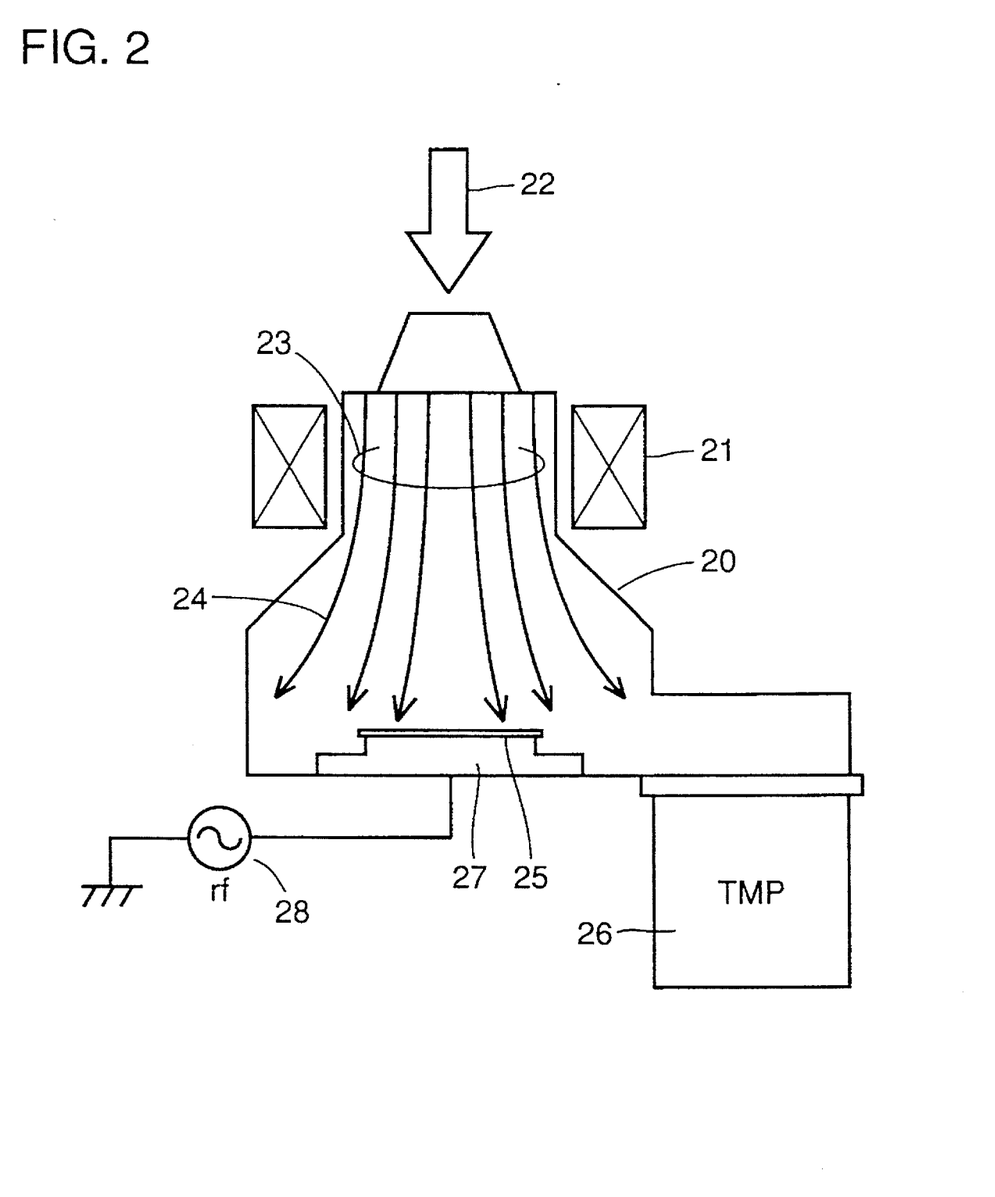
FIG. 2 shows a device structure of ECR type RIE.

FIG. 2 shows an example of the device structure of the ECR type RIE. A wafer 25 is mounted on a wafer stage 27 within a chamber 20. The inside of chamber 20 is evacuated by a pump 26. The reactive gas discharges by a high frequency 28. Furthermore, the power of a microwave (2.45 GHz) 22 is introduced from above wafer 25 and passes through an ECR zone 23. Electrons absorb the microwave. Thus, the reactive gas is highly efficiently ionized in the vicinity of wafer 25, achieving high ionization degree. ECR zone 23 is provided with a magnetic coil 21 of 875 Gauss in order to satisfy cyclotron resonance conditions.

Secondly, flow range of a reactive gas of $Cl_2$ and $NF_3$ will be described using the ECR type RIE. As has been described with the background art, the use of $NF_3$ only causes too great an etching effect and hence products adhering to the interior wall of chamber 20 of the etching system is undesirably etched, thereby producing foreign particles. Based on this fact, the change in the number of foreign particles was examined with flow ratio of $Cl_2$ and $NF^3$ varied. That is, the inside of the chamber is etched at a gas pressure of 1.2 mTorr and a microwave power/rf of 1400/60 W with the amount of additional $NF_3$ changed variously, and the foreign particles were evaluated. The interior wall of the chamber had a deposited film grown thereon to some extent using a gas mainly including $Cl_2$ after the wall had been dry-cleaned.

Figure 3:
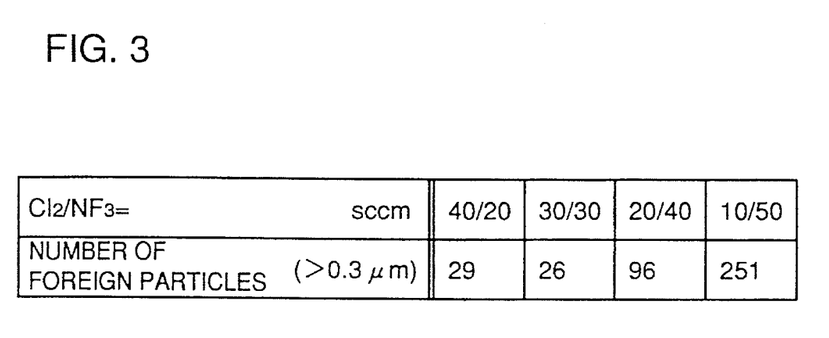
FIG. 3 indicates the relation between a mixed gas $Cl_2/NF_3$ flow and the number of the foreign particles detected.

The result is shown in FIG. 3. It has been found that when the total flow of $Cl_2$ and $NF_3$ is 60 sccm and $NF_3$ flow exceeds 40 sccm, that is, when a ratio of $NF_3$ flow relative to the total flow exceeds approximately 70%, the number of foreign particles ($\geq 0.3$ μm) abruptly increases. Also, it has been found that when $NF_3$ flow ratio does not exceed 70%, patterning of a wiring having a metal polycide structure can be actually controlled by the adjustment of magnetic range and rf power.

Thirdly, the pressure range of the reactive gas will be described. The pressure range has a great influence on dissociation of $NF_3$. If the pressure is high, nitrogen atoms decrease and hence the sidewall protecting film is not formed satisfactorily so that side-etching occurs. Thus, a wiring having a metal polycide structure was used and the gas pressure was changed to evaluate patterning shape. A microwave power/rf at the main etching time was set to be 1400/60 W and over-etching was then performed for 50% or 25% of the main etching time with $Cl_2/O_2$=50/10 sccm, a gas pressure of 0.8 mTorr and a microwave power/rf of 1400/60 W.

Figure 4:
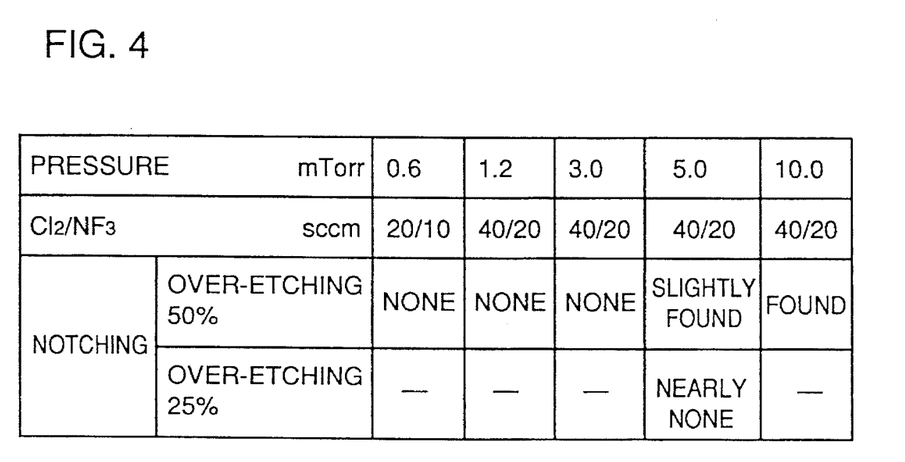
FIG. 4 indicates the flow and pressure of the mixed gas $Cl_2/NF_3$ and the shape etched.

The result is shown in FIG. 4. For the over-etching performed for 50% of the main etching time, which is often performed during the actual process, it has been found that notching phenomenon in which the sidewall is etched occurs when the gas pressure exceeds 5.0 mTorr.

According to the evaluation above, it has been found that $NF_3$ addition amount is preferably at most 70% and that the gas pressure is preferably at most 5.0 mTorr.

(First Embodiment)

Based on an example of the conditions according to the evaluation above, a first embodiment of the method of manufacturing the semiconductor device according to the present invention will now be described.

Firstly, a case in which a natural oxide film is broken through will be described with reference to the figures.

Figure 5:
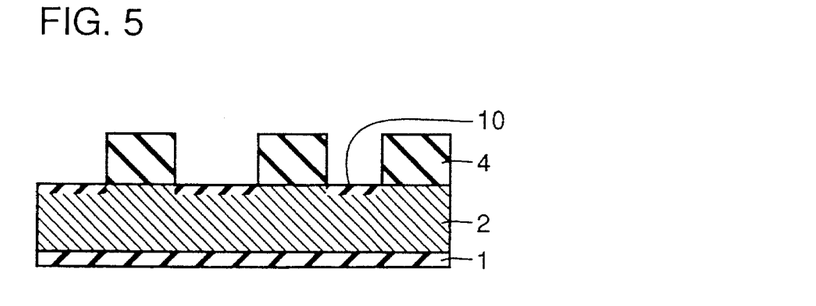
FIGS. 5 and 6 are cross sectional views illustrating one and subsequent steps of a method of manufacturing the semiconductor device according to a first embodiment of the present invention, respectively.
Figure 6:
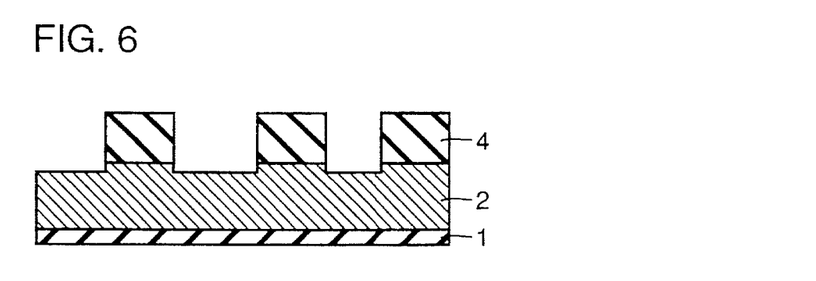
Figure 7:
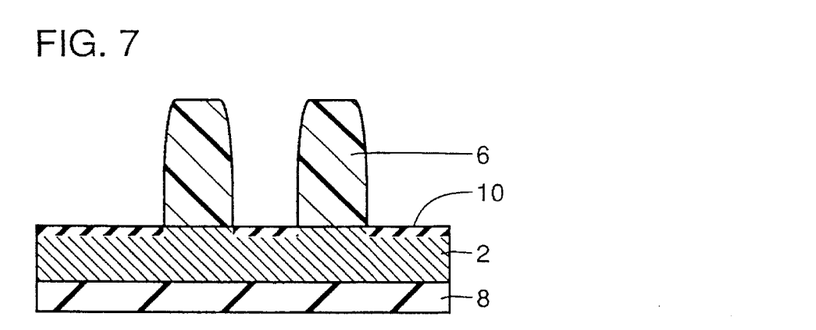
FIGS. 7 and 8 are cross sectional views illustrating another and subsequent steps of the method for manufacturing the semiconductor device according to the first embodiment of the present invention, respectively.
Figure 8:
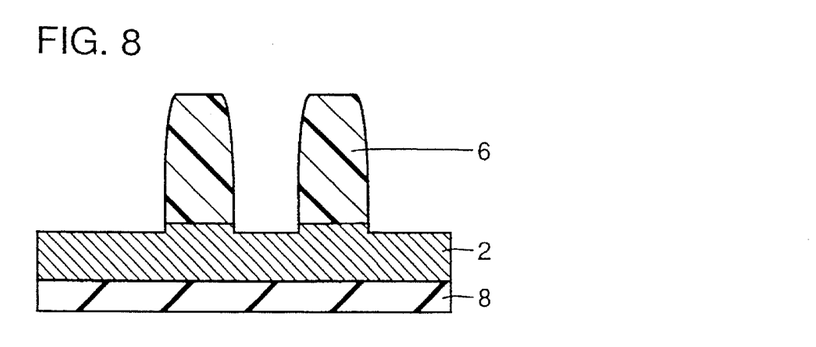

For example, as shown in FIG. 5, assume that a polysilicon film 2 formed on a gate oxide film 1 is patterned by using a silicon oxide film 4 as a mask. A natural oxide film 10 exists at a surface of polysilicon film 2. With this condition, natural oxide film 10 at the surface of polysilicon film 2 is anisotropically etched, as shown in FIG. 6., by using silicon oxide film 4 as a mask under the conditions of a mixed gas flow $Cl_2/NF_3$=40/20 sccm, a gas pressure of 1.2 mTorr and a microwave power/rf=1400/60 W. $NF_3$ almost completely dissociates and the nitrogen atoms act as a sidewall protecting film. This prevents a defective shape of the pattern and the cause of punch through of a gate oxide film, and improves uniformity of etching rate within the wafer surface. Accordingly, a pattern shape with high precision can be obtained. Furthermore, as shown in FIG. 7, when polysilicon film 2 formed on an underlying oxide film 8 is patterned by using a photoresist 6 as a mask, a desired pattern can be obtained as shown in FIG. 8 if the similar etching is performed. In fact, when polysilicon film 2 is anisotropically etched by using silicon oxide film 4 as a mask, etch residue which would be produced under the conditions of $Cl_2$=50 sccm, a gas pressure of 0.8 mTorr and a microwave power/rf=1400/60 W disappears by applying the conditions described above.

(Second Embodiment)

A case in which a gate electrode wiring having a metal polycide structure is patterned will now be described with reference to figures as a second embodiment of the method of manufacturing the semiconductor device according to the present invention.

Figure 9:
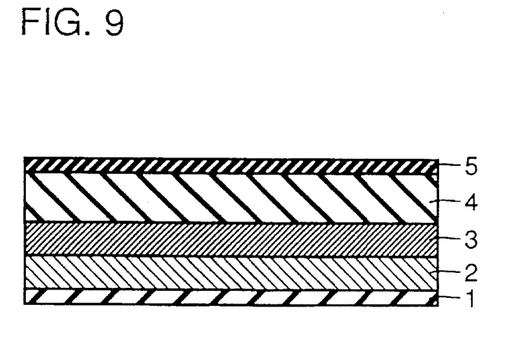
FIG. 9 is a cross sectional view illustrating one step of a method of manufacturing the semiconductor device according to a second embodiment of the present invention.
Figure 10:
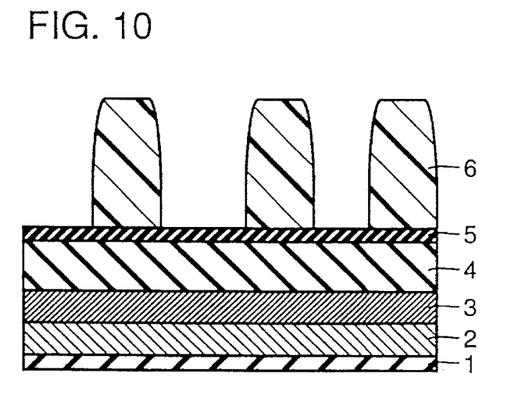
FIGS. 10, 11, 12, 13 and 14 are cross sectional views illustrating a series of steps following the step illustrated in FIG. 9.
Figure 11:
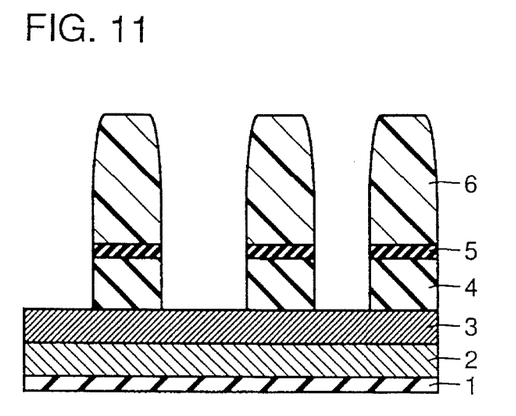
Figure 12:
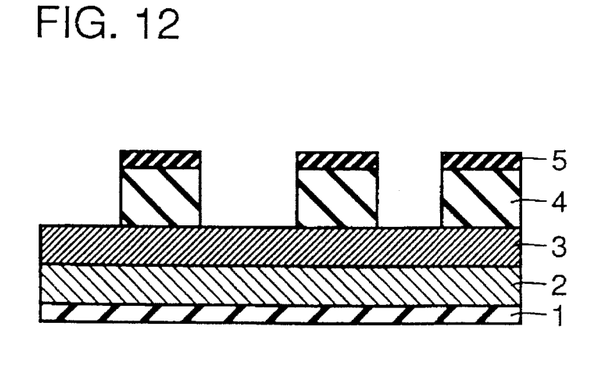

As shown in FIG. 9, gate oxide film 1 is formed on a substrate (not shown) and then polysilicon film 2 is deposited to a thickness of 1000 Å by low pressure CVD method. Then, a titanium silicide film 3 is formed to a thickness of 1000 Å by sputtering method or the like. Silicon oxide film 4 is then formed by low pressure CVD method to a thickness of 2000 Å. Furthermore, a silicon oxynitride film 5 is deposited to a thickness of 630 Å by plasma CVD method. Silicon oxynitride film 5 is used as an anti-reflection coating at the time of exposure. Then, photolithography is performed after resist is applied, and then photoresist 6 is patterned as shown in FIG. 10. Then, as shown in FIG. 11, photoresist 6 is used as a mask and silicon oxynitride film 5 and silicon oxide film 4 are anisotropically etched using $CHF_3$ or $CF_4$. Photoresist 6 is then removed as shown in FIG. 12. The process so far is the same as the anisotropic etching technique conventionally performed in general. Then, silicon oxide film 4 is used as a mask and titanium silicide film 3 and polysilicon film 2 are anisotropically etched under the conditions of a mixed gas flow $Cl_2/NF_3$= 40/20 sccm, a gas pressure of 1.2 mTorr, a microwave power/rf=1400/90 W, a magnetic flux density in the vicinity of the wafer of 30 Gauss (computation according to simulation) and a temperature of refrigerant for cooling the wafer stage of 30° C.

Figure 13:
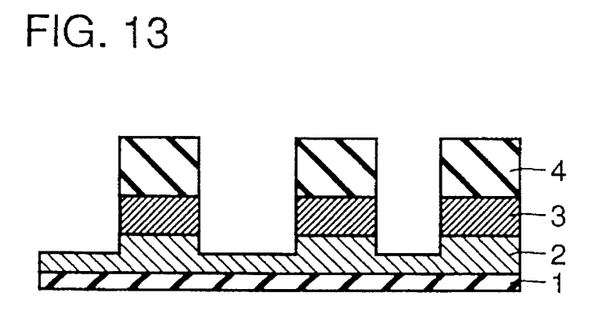

As shown in FIG. 13, silicon oxynitride film 5 as an anti-reflection coating is almost completely removed. Titanium silicide film 3 is completely etched anisotropically and polysilicon film 2 is left as having a thickness of 500 Å.

Then, the mixed gas is switched to $Cl_2/O_2$ without turning off the microwave. The remaining polysilicon film 2 is then etched under the conditions of a mixed gas flow $Cl_2/O_2$= 50/10 sccm, a gas pressure of 0.8 mTorr and a microwave power/rf=1400/60 W. Following this etching, an appropriate amount of over-etching is performed. The over-etching completely removes silicon oxynitride film 5 on silicon oxide film 4, as shown in FIG. 14.

By applying the etching method described above, the nitride film derived from nitride atoms contained in $NF_3$ gas acts on the sidewall portion of the pattern as a protecting film. This prevents side-etching of titanium silicide film 3 during over-etching, and a desired pattern shape can be obtained. Furthermore, silicon oxynitride film 5, titanium silicide film 3 and polysilicon film 2 can be sequentially etched in the same device. Accordingly, it is not necessary to use a different etching system for different kind of the film to be etched and the number of steps employed can be decreased, thereby reducing production cost and shortening manufacturing period. Furthermore, displacement of the wafer is not necessary and hence foreign particles can be prevented from adhering onto a surface of the wafer in wafer handling, thereby increasing yield of semiconductor devices.

Figure 14:
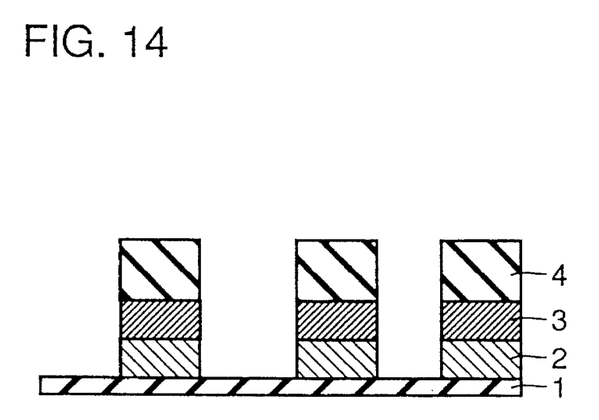

Furthermore, since silicon oxynitride film 5 is completely removed, a silicon oxide film (not shown) formed on silicon oxide film 4 after the step shown in FIG. 14 by low pressure CVD method or atmospheric pressure CVD method or the like, for example, can be prevented from being peeled off during depositing process. Furthermore, when a contact hole (not shown) is formed on a gate electrode including titanium silicide film 3, hole-forming etching can be prevented from terminating halfway, thereby forming a contact hole having a desired shape.

Furthermore, in switching the reactive gas from the mixed gas of $Cl_2/NF_3$ to the mixed gas of $Cl_2/O_2$, production of foreign particles with the ignition of plasma can be prevented by keeping the microwave turned on and maintaining the plasma while turning off the high frequency power only. Accordingly, production of foreign particles within the etching system can be prevented. Therefore, high yield of semiconductor devices can be achieved.

(Third Embodiment)

A case in which a polysilicon gate electrode wiring having an oxide film and a nitride film is patterned will now be described as a third embodiment.

Figure 15:
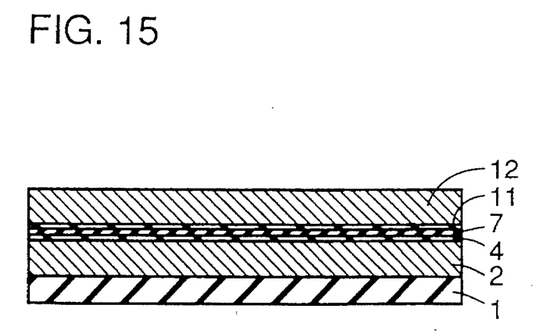
FIG. 15 is a cross sectional view illustrating one step of a method of manufacturing the semiconductor device according to a third embodiment of the present invention.
Figure 16:
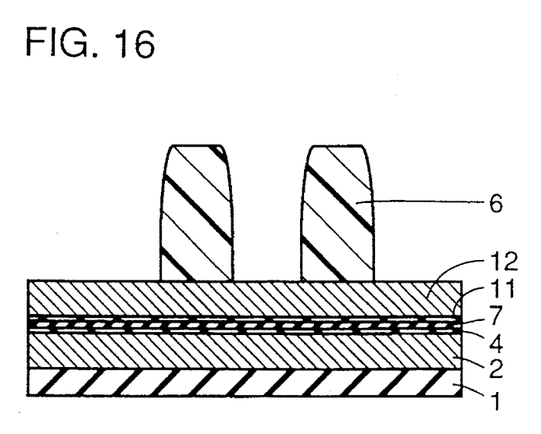
FIGS. 16, 17, 18, 19 and 20 are cross sectional views illustrating a series of steps following the step illustrated in FIG. 15.

This gate electrode structure is particularly applied as a gate electrode structure for flash memory. As shown in FIG. 15, after gate oxide film 1 is formed on a substrate (not shown), polysilicon film 2 is deposited to a thickness of 1000 Å by low pressure CVD method. Then, after silicon oxide film 4, a silicon nitride film 7 and a silicon oxide film 11 are sequentially formed by low pressure CVD method to a thickness of 70 Å, respectively, a polysilicon film 12 is formed to a thickness of 1000 Å. Photolithography is then performed after resist is applied, and photoresist 6 is patterned as shown in FIG. 16.

Figure 17:
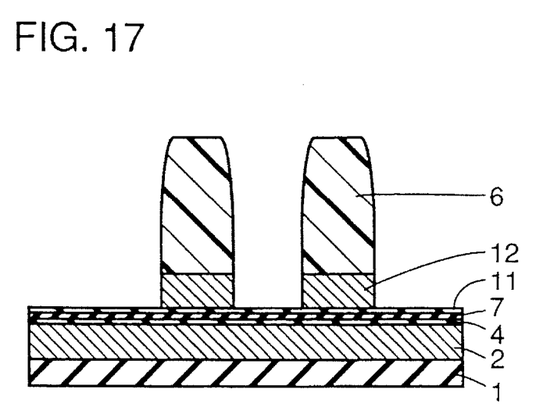

Then, photoresist 6 is used as a mask and polysilicon film 12 is anisotropically etched as shown in FIG. 17 under the conditions of a mixed gas flow $Cl_2/O_2=50/10$ sccm, a gas pressure of 0.8 mTorr and a microwave power/rf=1400/60 W.

Figure 18:
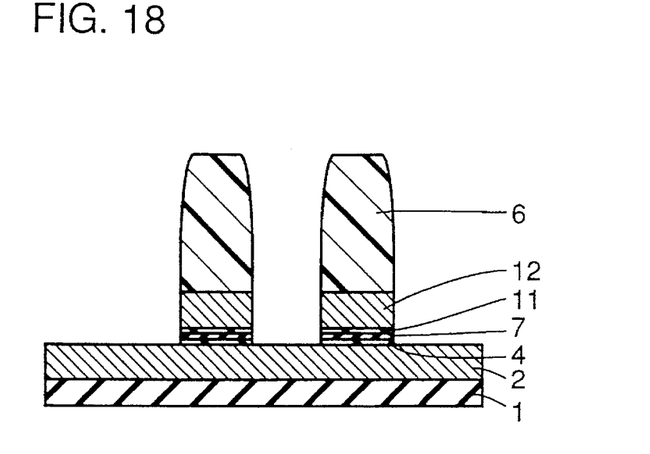

Then, the mixed gas is changed without turning off the microwave. As shown in FIG. 18, silicon oxide film 11, silicon nitride film 7 and silicon oxide film 4 are sequentially etched anisotropically under the conditions of a mixed gas flow $Cl_2/NF^3=40/20$ sccm, a gas pressure of 1.2 mTorr and a microwave power/rf=1400/60 W. Under those etching conditions, etching selectivity of a silicon oxide film relative to a polysilicon film is approximately one. That is, both the silicon oxide film and the polysilicon film are etched to the same extent. Therefore, polysilicon film 2 is etched immediately after etching of silicon oxide film 4 is finished. Observing plasma emission in the vicinity of the wafer surface, strong emission of SiCl is observed when etching of polysilicon film 2 is started. Accordingly, the end point of etching of silicon oxide film 4 can be detected by observing change in emission intensity of SiCl.

Figure 19:
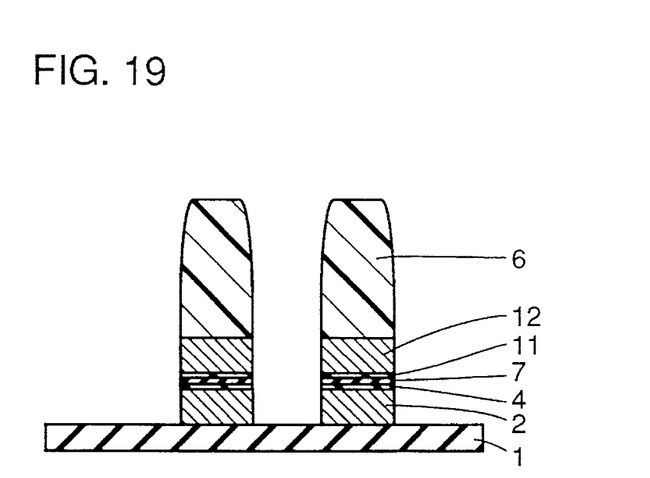
Figure 20:
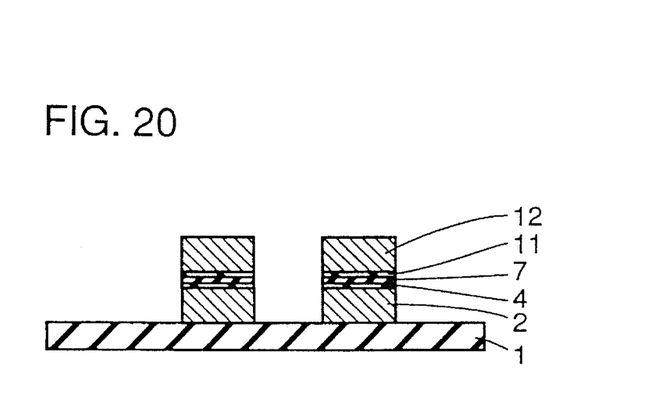

Using the above technique, the mixed gas is changed without turning off the microwave as soon as etching of polysilicon film 2 is started. As shown in FIG. 19, polysilicon film 2 is anisotropically etched again under the conditions of mixed gas flow $Cl_2/O_2=50/10$ sccm, a gas pressure of 0.8 mTorr and a microwave power/rf=1400/60 W. When gate oxide film 1 appears, an appropriate amount of over-etching is performed. Then, as shown in FIG. 20, photoresist 6 is removed and a desired gate electrode structure is formed.

As the etching method according to the present invention is applied as described above, the nitride film on the sidewall portion of the pattern serves as a strong protecting film. Accordingly, side-etching of polysilicon film 2 or the like can be prevented during over-etching, allowing vertical processing during of a pattern. Accordingly, a desired pattern shape can be obtained.

Furthermore, polysilicon film 12, silicon oxide film 11, silicon nitride film 7, silicon oxide film 4 and polysilicon film 2 can sequentially be etched in the same etching system. Therefore, it is not necessary to use a different etching system for different kind of the film to be etched and hence foreign particles can be prevented from adhering onto the wafer surface in wafer handling during the process. Furthermore, since it is not necessary to ignite plasma at the time of switching the reactive gases, production of foreign particles within the etching system can be suppressed. As a source producing foreign particles to the wafer surface is thus eliminated, high yield of semiconductor devices can be achieved. Furthermore, since the series of etching steps is performed in the same device, the number of steps employed can be greatly reduced. Accordingly, reduction in production cost as well as a shorter process period can be achieved.

(Fourth Embodiment)

Figure 21:
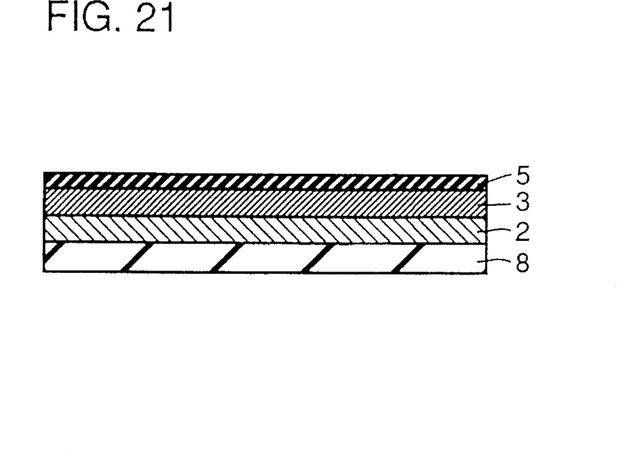
FIG. 21 is a cross sectional view illustrating one step of a method of manufacturing the semiconductor device according to a fourth embodiment of the present invention.
Figure 22:
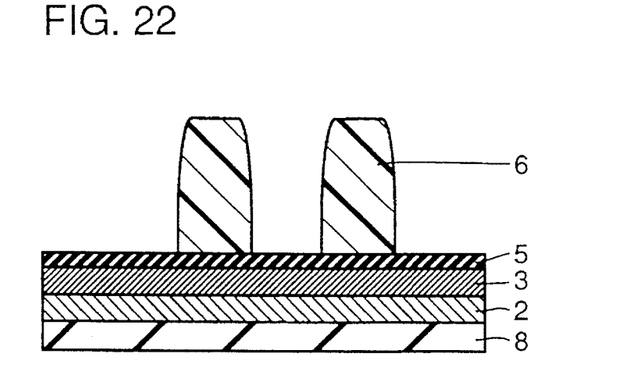
FIGS. 22, 23, 24 and 25 are cross sectional views illustrating a series of steps following the step illustrated in FIG. 21.

A case in which a wiring having a metal polycide structure is formed by using a resist mask will now be described as a fourth embodiment. As shown in FIG. 21, polysilicon film 2 is deposited on an underlying oxide film 8 to a thickness of 500 Å by low pressure CVD method. Then, titanium silicide film 3 is formed to a thickness of 500 Å by sputtering method. Furthermore, silicon oxynitride film 5 is formed as an antireflection coating to a thickness of 250 Å by plasma CVD method. Photolithography is then performed after resist is applied, and photoresist 6 is patterned as shown in FIG. 22.

Figure 23:
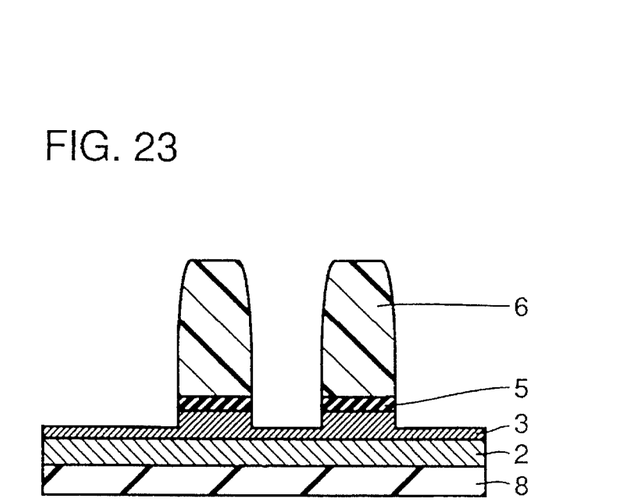

Then, photoresist 6 is used as a mask and etching is performed for 30 seconds under the conditions of a mixed gas flow $Cl_2/NF_3=40/20$ sccm, a gas pressure of 1.2 mTorr and a microwave power/rf=1400/60 W, and silicon oxynitride film 5 is anisotropically etched and so is titanium silicide film 3 by approximately 300 Å, as shown in FIG. 23.

Figure 24:
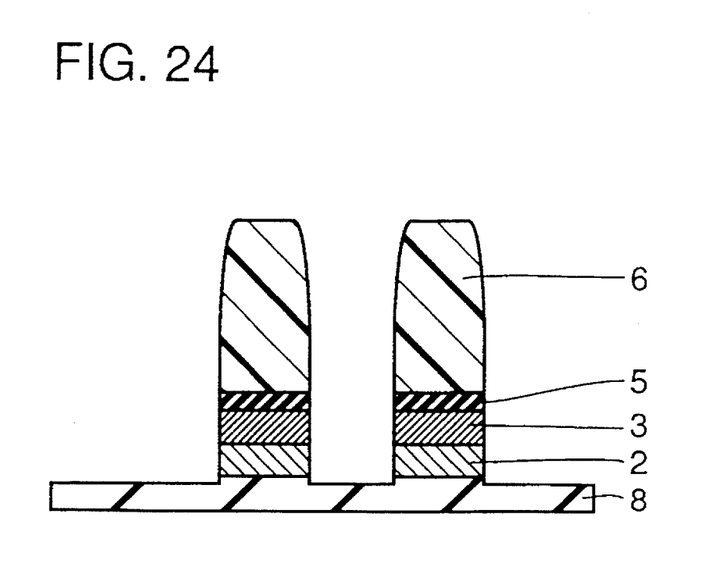
Figure 25:
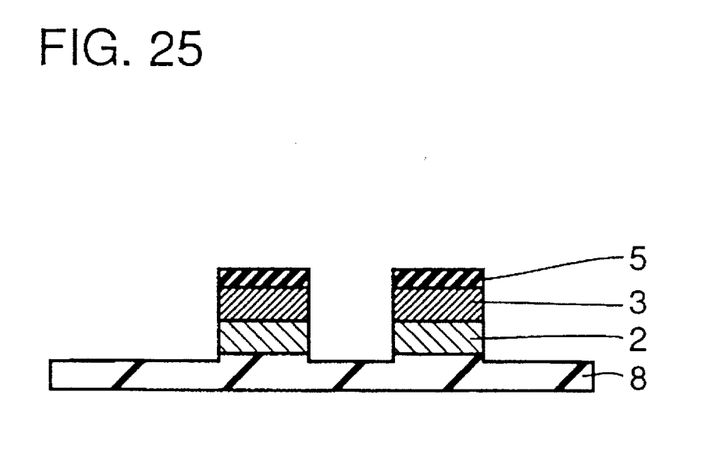

Then, by switching to a reactive gas which has conventionally been used for etching a metal silicide film without turning off the microwave, the remaining titanium silicide film 3 and polysilicon film 2 are anisotropically etched as shown in FIG. 24. An adequate amount of over-etching is then performed. Then, photoresist 6 is removed and a desired wiring structure is formed as shown in FIG. 25.

By thus applying the etching method according to the present invention, sidewalls of titanium silicide film 3 and polysilicon film 2 are never etched during over-etching since the nitride film on the sidewall of the pattern protects the sidewall. Therefore, a desired wiring structure pattern can be obtained. Furthermore, since etching process is performed in the same etching system, production of foreign particles within the etching system due to wafer handling or plasma ignition is suppressed. Therefore, adhesion of foreign particles onto the wafer surface can be decreased and hence high yield of semiconductor devices can be achieved. Furthermore, the number of etching steps can be reduced and hence reduction in production cost as well as a shorter process period can be achieved.

(Fifth Embodiment)

A case in which a gate electrode wiring having a metal polycide structure is formed will now be described as a fifth embodiment. The present embodiment particularly has a structure having a silicon oxide film on a metal polycide film as a stopper film for ions implanted during subsequent step of ion implanting process.

Figure 26:
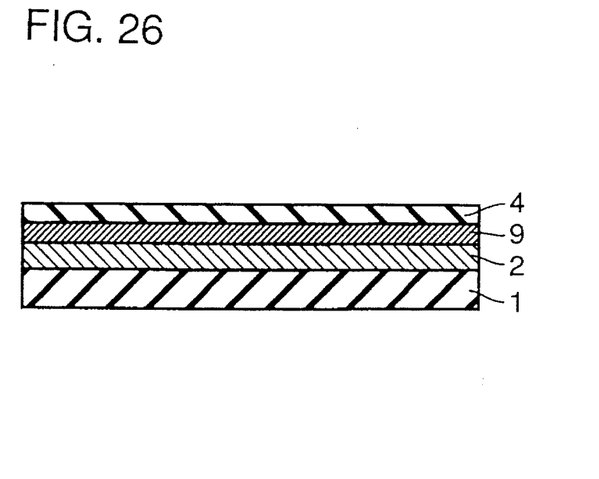
FIG. 26 is a cross sectional view illustrating one step of a method of manufacturing the semiconductor device according to a fifth embodiment of the present invention.
Figure 27:
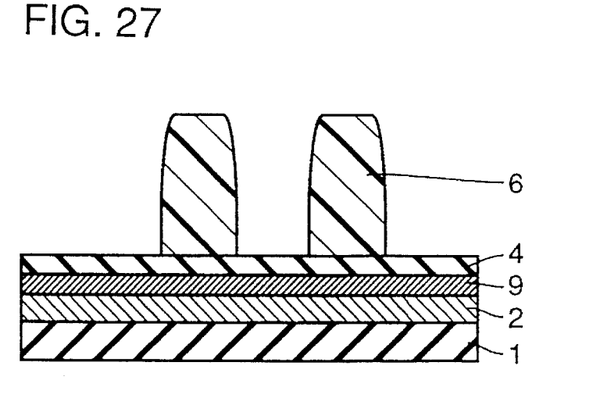
FIGS. 27, 28, 29 and 30 are cross sectional views illustrating a series of steps following the step illustrated in FIG. 26.

As shown in FIG. 26, after gate oxide film 1 is formed on a substrate (not shown), polysilicon film 2 is deposited to a thickness of 500 Å by low pressure CVD method. Then, a tungsten silicide film 9 is formed to a thickness of 500 Å by sputtering method. Silicon oxide film 4 is then formed to a thickness of 700 Å by low pressure CVD method. Then, photolithography is performed after photoresist is applied, and photoresist 6 is patterned as shown in FIG. 27.

Figure 28:
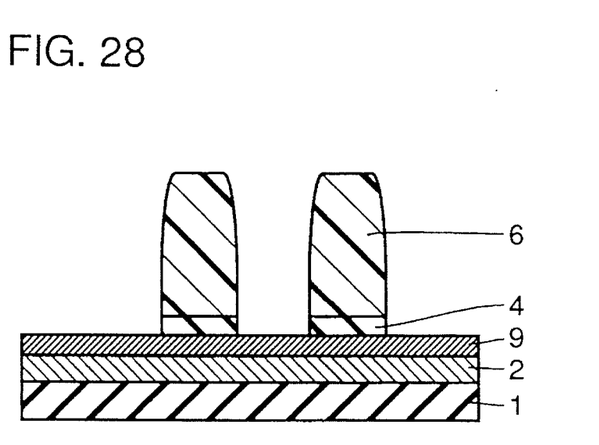
Figure 29:
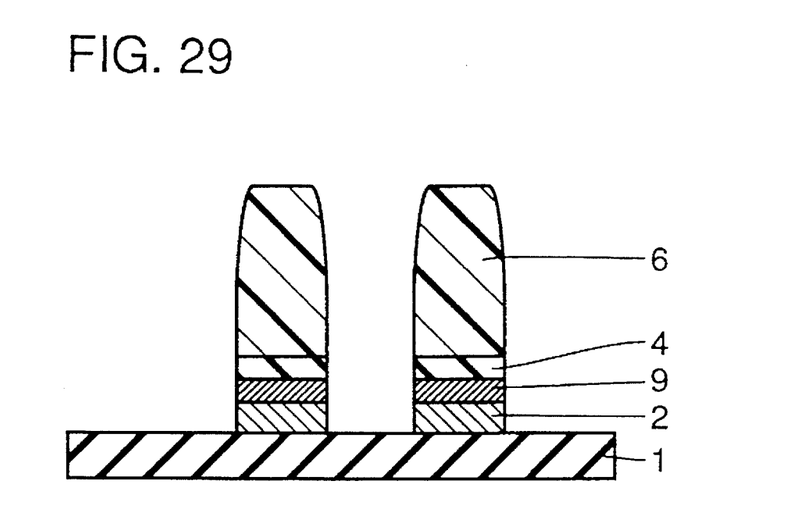
Figure 30:
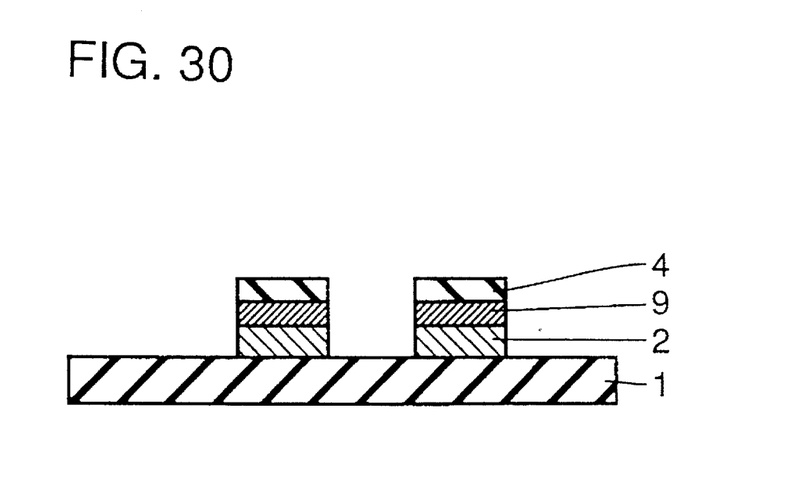

Then, photoresist 6 is used as a mask and silicon oxide film 4 is anisotropically etched under the conditions of a mixed gas flow $Cl_2/NF_3=40/20$ sccm, a gas pressure of 1.2 mTorr and a microwave power/rf=1400/90 W, as shown in FIG. 28. When etching of silicon oxide film 4 is finished and etching of tungsten silicide film 9 is started, plasma emission intensity of SiCl increases. At that time, the conditions of the mixed gas is switched to $Cl_2/O_2=50/10$ sccm and a gas pressure of 0.8 mTorr and the microwave power/rf is switched to 1400/60 W without turning off the microwave. Then, as shown in FIG. 29, after the remaining tungsten silicide film 9 and polysilicon film 2 are etched, an appropriate amount of over-etching is performed. Then, as shown in FIG. 30, photoresist 6 is removed and a desired gate electrode structure is formed. As the etching method according to the present invention is thus applied, sidewalls of silicon oxide film 4 and tungsten silicide film 9 are never etched during the over-etching. Accordingly, a desired wiring structure can precisely be formed. Also, since the series of etching steps is performed in the same etching system, adhesion of foreign particles onto a wafer surface can be reduced and hence high yield of semiconductor devices can be achieved. Furthermore, the number of steps employed as well as production cost can be reduced.

The case in which a mixed gas flow $Cl_2/NF_3$ is 40/20 sccm, that is, a case in which $NF_3$ flow relative to the total flow is 33% and the gas pressure is 1.2 mTorr has been described in the first to fifth embodiments. However, as has been described above, a similar effect can be obtained provided that $NF_3$ flow relative to the total flow does not exceed 70% and the gas pressure does not exceed 5.0 mTorr.

Although the case in which etching by the mixed gas $Cl_2/NF_3$ followed by etching by the mixed gas $Cl_2/O_2$ is performed has also been described, a similar effect can be obtained even when a mixed gas of $HBr/O_2$ is used. Furthermore, a similar effect can be obtained by using $Cl_2$ only and lowering RF bias. That is, the reactive gases illustrated above are not exclusive and any reactive gases having an etching rate for a polysilicon film higher than that for an oxide film can be applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, which method comprises etching a multi-layer film comprising a conductive film and/or an insulating film using a mixed gas containing $Cl_2$ and $NF_3$ at a vacuum of 0.1–5.0 mTorr with an electron density of at least $10^{10}/cm_3$; and said mixed gas having $NF^3$ flow ratio of at most 70% relative to the total flow, wherein said conductive film includes a metal silicide film and/or a polysilicon film.

2. The method of manufacturing a semiconductor device according to claim 1, wherein said metal silicide film includes a titanium silicide film or a tungsten silicide film.

3. The method of manufacturing a semiconductor device according to claim 1, wherein said multi-layer film comprises an insulating film containing silicon oxide and/or an insulating film containing silicon nitride.

4. The method of manufacturing a semiconductor device according to claim 1, wherein said multi-layer film comprises an insulating film containing silicon oxynitride.

5. The method of manufacturing a semiconductor device according to claim 1, further comprising, after said step of etching said multi-layer film using said mixed gas containing $Cl_2$ and $NF_3$, the step of etching said multi-layer film using a mixed gas containing $Cl_2$ or HBr at said degree of vacuum of 0.1–5.0 mTorr with said electron density of at least $10^{10}/cm^3$.

6. The method of manufacturing a semiconductor device according to claim 5, wherein said conductive film includes a metal silicide film and/or a polysilicon film.

7. The method of manufacturing a semiconductor device according to claim 6, wherein said metal silicide film includes a titanium silicide film or a tungsten silicide film.

8. The method of manufacturing a semiconductor device according to claim 5, wherein said insulating film includes a silicon oxide film and/or a silicon nitride film.

9. The method of manufacturing a semiconductor device according to claim 5, wherein said insulating film includes a silicon oxynitride film.

10. The method of manufacturing a semiconductor device according to claim 5, wherein said mixed gas contains HBr and $O_2$.

\* \* \* \* \*